United States Patent
Hertkorn et al.

(10) Patent No.: US 9,466,759 B2
(45) Date of Patent: Oct. 11, 2016

(54) OPTOELECTRONIC DEVICE AND METHOD FOR PRODUCING AN OPTOELECTRONIC DEVICE

(71) Applicant: OSRAM Opto Semiconductors GmbH, Regensburg (DE)

(72) Inventors: Joachim Hertkorn, Woerth an der Donau (DE); Jan-Philipp Ahl, Regensburg (DE); Lorenzo Zini, Regensburg (DE); Matthias Peter, Regensburg (DE); Tobias Meyer, Ihrlerstein (DE); Alexander Frey, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/430,538

(22) PCT Filed: Sep. 18, 2013

(86) PCT No.: PCT/EP2013/069356
§ 371 (c)(1),
(2) Date: Mar. 23, 2015

(87) PCT Pub. No.: WO2014/048805
PCT Pub. Date: Apr. 3, 2014

(65) Prior Publication Data
US 2015/0270434 A1 Sep. 24, 2015

(30) Foreign Application Priority Data
Sep. 27, 2012 (DE) ........................ 10 2012 217 644

(51) Int. Cl.
*H01L 33/32* (2010.01)
*H01L 33/00* (2010.01)
(Continued)

(52) U.S. Cl.
CPC ....... *H01L 33/0075* (2013.01); *H01L 21/0254* (2013.01); *H01L 21/02458* (2013.01);
(Continued)

(58) Field of Classification Search
None
See application file for complete search history.

(56) References Cited

U.S. PATENT DOCUMENTS

| 5,328,549 A | 7/1994 | Bozler et al. |
| 9,293,640 B2 | 3/2016 | Hertkorn et al. |

(Continued)

FOREIGN PATENT DOCUMENTS

| DE | 102008022503 A1 | 11/2008 |
| EP | 1041610 A1 | 10/2000 |

(Continued)

OTHER PUBLICATIONS

Habel, F.S. "Methods for defect reduction of gallium nitride substrates and gallium nitride quasi substrates," Dissertation; Ulm, Jul. 13, 2006; chapter 6, pp. 107-109.

(Continued)

*Primary Examiner* — Alexander Ghyka
(74) *Attorney, Agent, or Firm* — McDermott Will & Emery LLP

(57) ABSTRACT

A method is provided for producing an optoelectronic device, comprising the steps of providing a substrate, applying a nucleation layer on a surface of the substrate, applying and patterning a mask layer on the nucleation layer, growing a nitride semiconductor in a first growth step, wherein webs are laid which form a lateral lattice, wherein the webs have trapezoidal cross-sectional areas in places in the direction of growth, and laterally overgrowing the webs with a nitride semiconductor in a second growth step, to close spaces between the webs.

14 Claims, 4 Drawing Sheets

(51) Int. Cl.
*H01L 21/02* (2006.01)
*H01L 33/02* (2010.01)
*H01L 33/14* (2010.01)
*H01L 33/22* (2010.01)

(52) U.S. Cl.
CPC ... *H01L21/02639* (2013.01); *H01L 21/02647* (2013.01); *H01L 33/007* (2013.01); *H01L 33/025* (2013.01); *H01L 33/14* (2013.01); *H01L 33/32* (2013.01); *H01L 33/0079* (2013.01); *H01L 33/22* (2013.01)

(56) References Cited

U.S. PATENT DOCUMENTS

| | | |
|---|---|---|
| 2006/0266281 A1 | 11/2006 | Beaumont et al. |
| 2007/0181895 A1 | 8/2007 | Nagai |
| 2008/0210957 A1 | 9/2008 | Watanabe et al. |
| 2009/0061636 A1 | 3/2009 | Lee et al. |
| 2010/0072513 A1* | 3/2010 | Lourdudoss ........ H01L 21/0237 257/183 |
| 2010/0261300 A1 | 10/2010 | Tu et al. |
| 2010/0264401 A1 | 10/2010 | Adivarahan et al. |
| 2012/0080660 A1 | 4/2012 | Jung et al. |
| 2015/0031150 A1 | 1/2015 | Hertkorn et al. |
| 2016/0062406 A1 | 3/2016 | Watanabe et al. |

FOREIGN PATENT DOCUMENTS

| | | |
|---|---|---|
| EP | 1071143 A1 | 1/2001 |
| EP | 1806790 A2 | 7/2007 |
| EP | 2390928 A2 | 11/2011 |
| JP | 2007184411 A | 7/2007 |
| WO | WO-9930373 A1 | 6/1999 |
| WO | WO-2009146583 A1 | 12/2009 |

OTHER PUBLICATIONS

Wunderer, T. "Three-dimensional light emitting InGaN structures with reduced piezoelectric field," Dissertation; Ulm, Jul. 28, 2010; pp. 3-5.

U.S. Appl. No. 14/418,424, entitled "Method for Producing an Optoelectronic Semiconductor Chip and Optoelectronic Semiconductor Chip," filed Jan. 29, 2015.

* cited by examiner

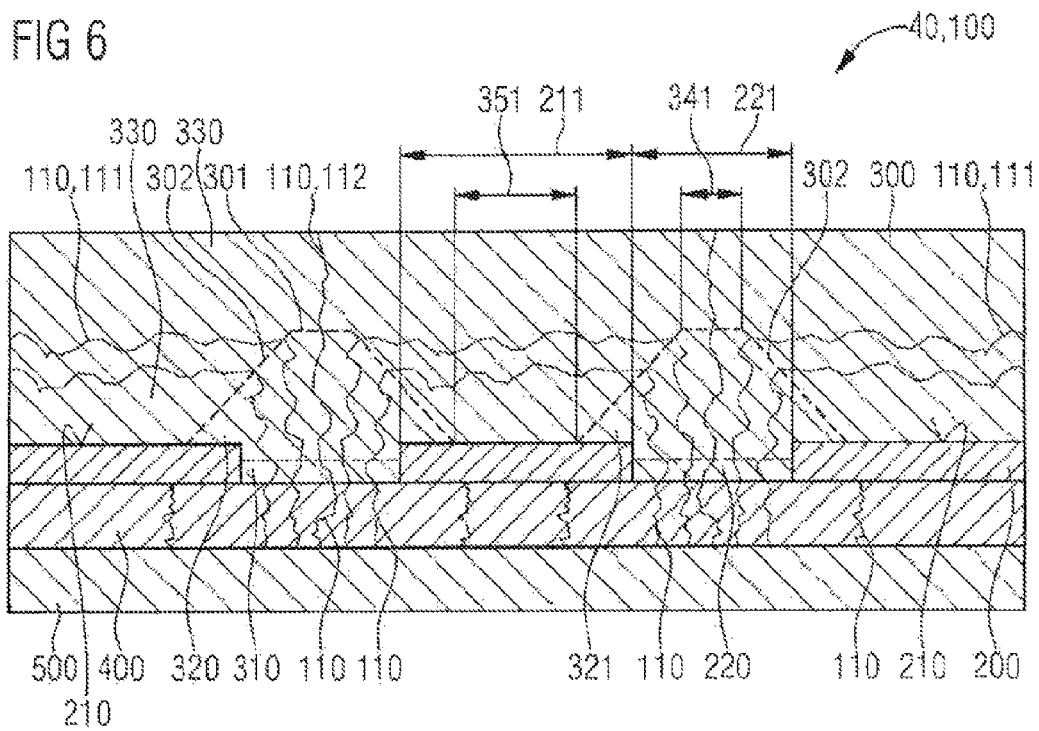
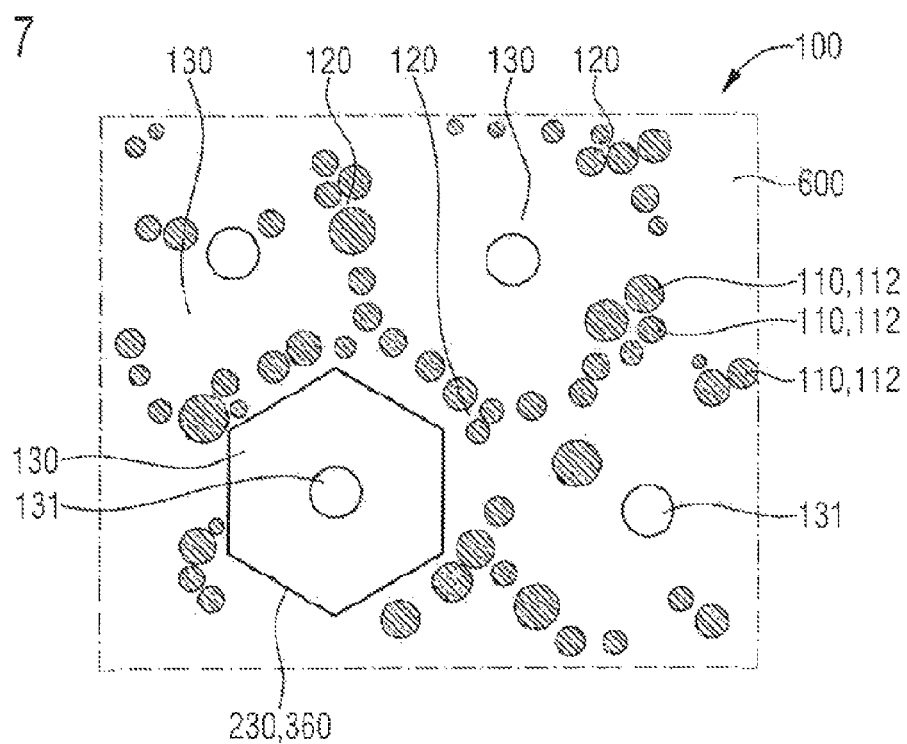

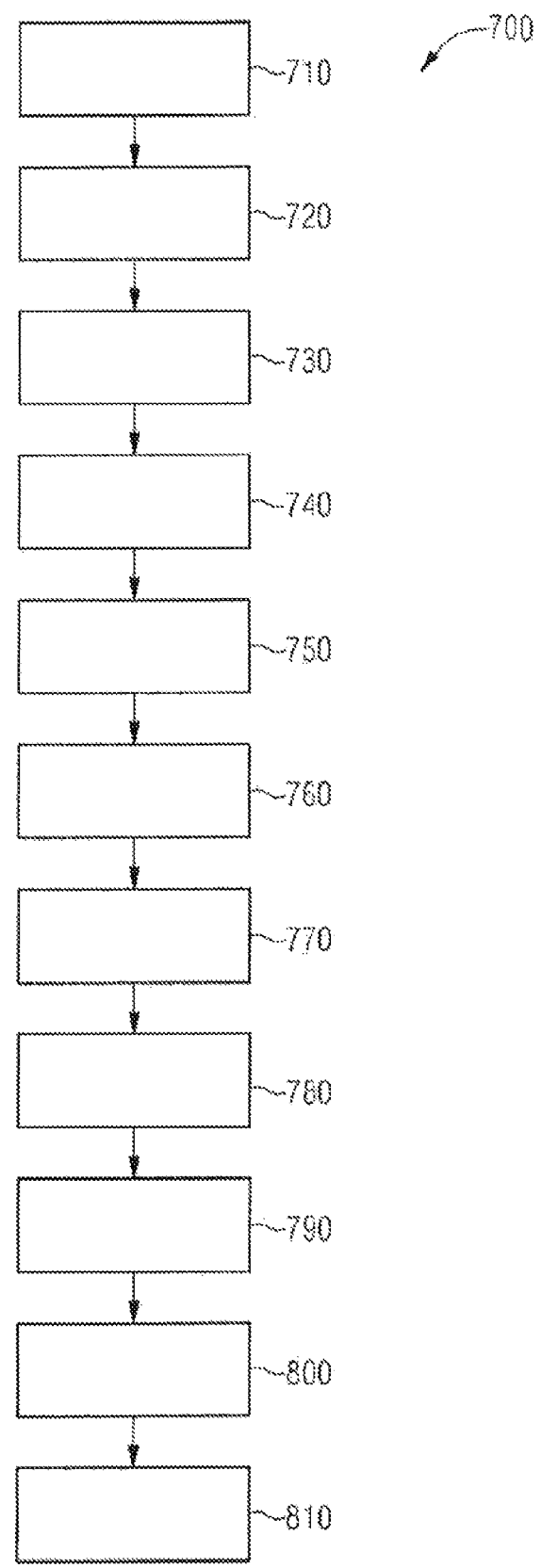

OPTOELECTRONIC DEVICE AND METHOD FOR PRODUCING AN OPTOELECTRONIC DEVICE

The present invention relates to a method for producing an optoelectronic device and to an optoelectronic device.

In the case of light-emitting diodes based on aluminium indium gallium nitride (AlInGaN), it is known that an emitted light output grows in a less than linear manner with the input electrical power as said electrical power increases. This phenomenon is known as droop.

It is known that the linearity of such light-emitting diodes may be increased through the use of active zones with a plurality of quantum films. Conventionally up to 30 quantum films are provided. (Al)(In)GaN barriers are arranged between the individual quantum films, in order to keep constant the crystal quality in the quantum film sequence. The barriers typically have a thickness of between 3 nm and 5 nm. Maximally thin barriers are desirable, since they form lower piezoelectric barriers for charge carriers moving in the vertical direction and thus allow improved vertical charge carrier transport. It is known that the barriers may be thinner, the lower the dislocation density in the crystal in the plane of the active zone. The dislocation density is typically in the range between $20 \times 10 \text{ cm}^{-2}$ and $100 \times 10^7 \text{ cm}^{-2}$.

One object of the present invention consists in providing an improved method for producing an optoelectronic device. A further object of the present invention consists in providing an improved optoelectronic device. These objects are achieved by a method or an optoelectronic device having the features of the independent claims. Preferred further developments are stated in the dependent claims.

A method for producing an optoelectronic device comprises steps of providing a substrate, applying a nucleation layer on a surface of the substrate, applying and patterning a mask layer on the nucleation layer, growing a nitride semiconductor in a first growth step, wherein webs are laid which form a lateral lattice, wherein the webs have trapezoidal cross-sectional areas in places in the direction of growth, and laterally overgrowing the webs with a nitride semiconductor in a second growth step, to close spaces between the webs. Advantageously, this method allows the production of an optoelectronic device with laterally varying defect density. Defect-rich lateral portions of the optoelectronic device may then advantageously carry an increased vertical current flow. Charge carriers from the defect-rich lateral portions may advantageously diffuse into lateral regions with fewer defects and there radiantly recombine.

In one embodiment of the method, the spaces between the webs are of frustopyramidal configuration. Advantageously, the lateral overgrowth of the webs in the second growth step brings about bending of dislocation defects at the facets of the webs facing the frustopyramidal spaces, whereby a reduced defect density forms in regions above the frustopyramidal spaces.

In one embodiment of the method disc-shaped lateral mask regions are applied during patterning of the mask layer. Advantageously, the spaces above the disc-shaped lateral mask regions thereby form during the first growth step.

In one embodiment of the method, the disc-shaped mask regions are arranged in a lateral hexagonal lattice. Advantageously, this results in complete, uniform lateral tiling.

In one embodiment of the method, the disc-shaped mask regions are applied with a diameter of between 0.5 µm and 3 µm. Advantageously, the resultant lateral portions with reduced defect density thereby have a suitable size to be supplied by charge carriers diffusing in from adjacent defect-rich portions.

In one embodiment of the method, the disc-shaped mask regions are applied separated from one another by regions with a width of between 0.5 µm and 2 µm. Advantageously, the resultant lateral portions of elevated defect density thereby have a size which allows a favourable compromise between sufficient vertical current flow and the avoidance of non-radiant charge carrier recombination.

In one embodiment of the method, the second growth step is performed under growth parameters which promote coalescence. Advantageously, in the second growth step the spaces between the webs thereby substantially close up, whereby in the regions of the spaces lateral portions with reduced defect density arise.

In one embodiment of the method, the first growth step is performed at a lower temperature than the second growth step. Advantageously, in the first growth step this results substantially in growth in the vertical direction, while during the second growth step growth in the lateral direction primarily takes place.

In one embodiment of the method, after the second growth step a functional layer sequence is deposited, which comprises an actively luminous layer. Advantageously, a larger number of V-defects thereby forms in regions of the actively luminous layer arranged above the defect-rich lateral portions than in the regions above the lateral portions with fewer defects. Advantageously, the higher density of V-defects allows an elevated current flow in the vertical direction.

In one embodiment of the method, a nitride semiconductor is deposited in openings in the mask layer prior to the first growth step, wherein etching back is then carried out. This advantageously results in reduced distortions in the multilayer structure which arises.

In one embodiment of the method, the nucleation layer comprises aluminium (Al). Advantageously, epitaxial growth may be carried out on a nucleation layer comprising aluminium.

In one embodiment of the method, the mask layer comprises two layers which comprise silicon dioxide ($SiO_2$). The layers of the mask layer comprising silicon dioxide are in this case separated by a layer comprising silicon nitride (SiN). Advantageously, the layers of this mask layer comprising silicon dioxide may then be separated from one another during a subsequent method step at the layer comprising silicon nitride.

In one embodiment of the method, the multilayer structure arranged on the nucleation layer is detached, wherein parts of the mask layer arranged on the detached multilayer structure are used as a hard mask for producing patterned outcoupling structures. Advantageously, no additional mask structures have then to be applied to produce the patterned outcoupling structures. This advantageously simplifies the method.

An optoelectronic device has a multilayer structure which has a higher dislocation density in a lattice-shaped lateral region than in other lateral regions. Advantageously, in this optoelectronic device an elevated vertical current may flow in the lateral regions with higher dislocation density. In this case, flowing charge carriers may advantageously diffuse out of the lattice-shaped lateral region with higher dislocation density into the adjacent other lateral regions and there radiantly recombine. This advantageously results in good high current linearity of the optoelectronic device.

In one embodiment of the optoelectronic device, a gaseous inclusion is arranged in another lateral region surrounded by the lattice-shaped lateral region. Advantageously, the gaseous inclusion points to otherwise complete closure of the lateral region with lower dislocation density.

In one embodiment of the optoelectronic device, the multilayer structure has an actively luminous layer. In this case, the actively luminous layer has a higher density of V-defects in the lattice-shaped lateral region than in the other lateral regions. Advantageously, the V-defects in the lattice-shaped lateral region with higher dislocation density bring about a reduction in the piezoelectric barriers to be overcome by charge carriers flowing in the vertical direction, whereby in the lattice-shaped lateral region an elevated current may flow in the vertical direction through the actively luminous layer of the multilayer structure. Consequently, charge carriers may diffuse out of the lattice-shaped lateral region into the other lateral regions and there radiantly recombine.

In one embodiment of the optoelectronic device, the lattice-shaped lateral region forms a hexagonal lattice. Advantageously, a hexagonal lattice constitutes favourable lateral tiling, whereby the other lateral regions with reduced dislocation density are distributed uniformly between the lattice-shaped lateral region with higher dislocation density.

In one embodiment of the optoelectronic device, the multilayer structure has an actively luminous layer. In this case, the lattice-shaped lateral region is configured to inject a higher number of charge carriers per surface area into the actively luminous layer than the other lateral region. This advantageously results in good high current linearity of the optoelectronic device.

The above-described characteristics, features and advantages of this invention and the manner in which these are achieved will become clearer and more distinctly comprehensible from the following description of the exemplary embodiments, which are explained in greater detail in connection with the drawings. In the figures, in each case in a highly schematic representation FIG. 1 shows a section through a multilayer structure in a first processing state;

FIG. 6 shows a section through the multilayer structure in a fourth processing state;

FIG. 7 is a plan view onto a functional layer sequence of the multilayer structure; and FIG. 8 shows a flow diagram of a method for producing an optoelectronic device.

Figure 1:
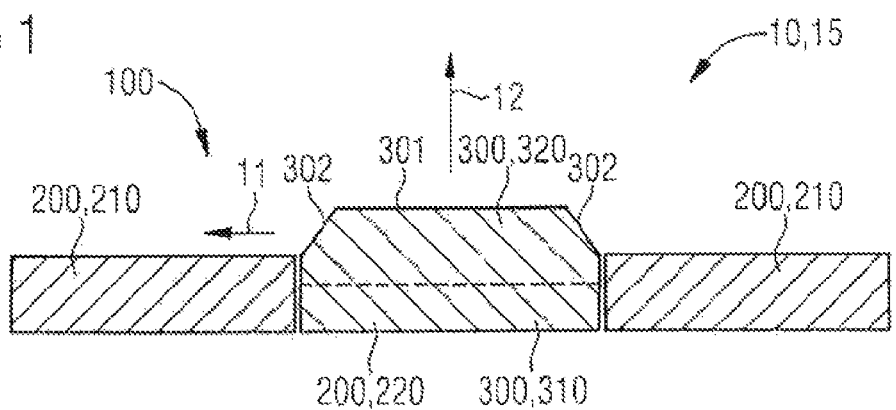

FIG. 1 is a highly schematic representation of a section through a part of a multilayer structure 100 in a first processing state 10. The multilayer structure 100 is part of an optoelectronic device, in particular of an LED chip of a light-emitting diode.

The multilayer structure 100 comprises a patterned mask layer 200 with lateral mask regions 210, which are separated from one another by openings 220 in the mask. The mask layer 200 may for example comprise silicon dioxide (SiO2).

The multilayer structure 100 additionally comprises a nitride semiconductor layer 300. The nitride semiconductor layer 300 comprises a first layer part 310, which is arranged in the region of the mask opening 220 between the lateral mask regions 210 of the mask layer 200. The first layer part 310 may for example comprise gallium nitride (GaN). The first layer part 310 could also be omitted.

The nitride semiconductor layer 300 further comprises a second layer part 320. In the first processing state 10 shown in FIG. 1, the second layer part 320 is not yet fully present. The first processing state 10 illustrated in FIG. 1 shows the multilayer structure 100 during performance of a first growth step 15 for growing the second layer part 320. The second layer part 320 is grown epitaxially during the first growth step 15. The second layer part 320 preferably likewise comprises gallium nitride.

The growth conditions during the first growth step 15 are selected such that growth of the second layer part 320 takes place mainly in a vertical growth direction 12 on a c-surface 301 of the resultant nitride semiconductor layer 300. Only slight growth occurs in a lateral growth direction 11 on {11$\overline{2}$2} surfaces of the resultant nitride semiconductor layer 300. In this way, the resultant second layer part 320 tapers in the lateral direction as the vertical direction increases.

Figure 2:
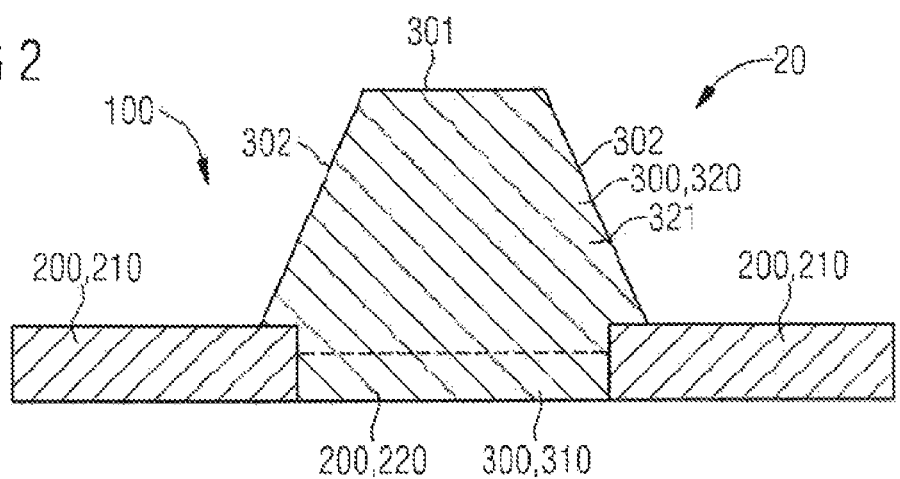
FIG. 2 shows a section through the multilayer structure in a second processing state.

FIG. 2 shows a schematic sectional representation of the multilayer structure 100 in a second processing state 20. The second processing state 20 is achieved after the first growth step 15 shown in FIG. 1 has been carried out for a limited period. In the sectional representation of FIG. 2, the second layer part 320 of the nitride semiconductor layer 300 produced in the first growth step 15 has a trapezoidal cross-sectional area 321 at least in places.

Had the first growth step 15 been continued for longer, growth of the second layer part 320 would have continued in the vertical growth direction 12 until the side faces 302 of the nitride semiconductor layer 300 touched one another and the c-surface 301 of the nitride semiconductor layer 300 disappeared. Then, the resultant second layer part 320 would have had a triangular cross-sectional area in the sectional representation of FIG. 2. However, the first growth step 15 was broken off at an earlier point.

Figure 3:
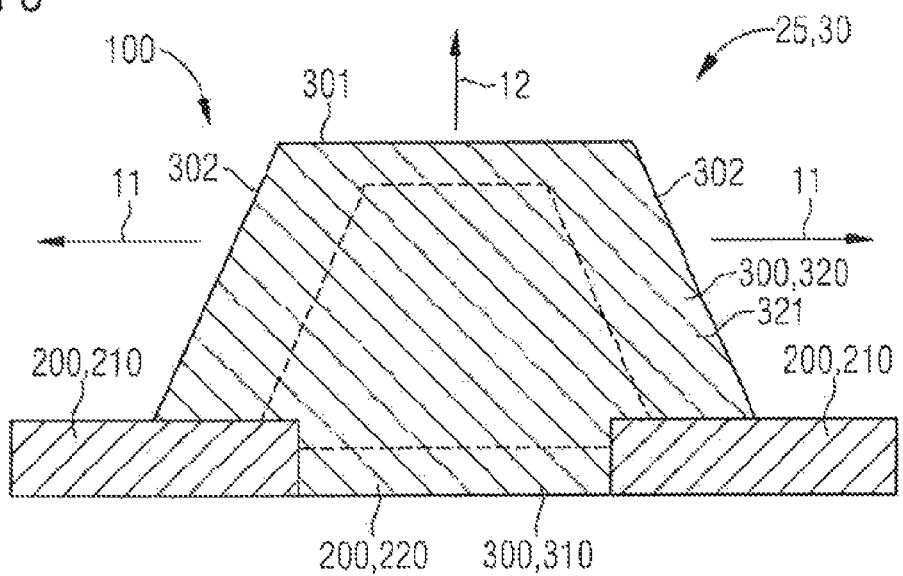
FIG. 3 shows a section through the multilayer structure in a third processing state.

FIG. 3 shows a schematic sectional representation of the multilayer structure 100 in a third processing state 30 during performance of a second growth step 25. The second growth step 25 is likewise an epitaxial growth step, but performed under different growth conditions from the first growth step 15. The second growth step 25 is performed under growth conditions which promote coalescence. During the second growth step 25 a third layer part 330 of the nitride semiconductor layer 300 is grown. The third layer part 330 of the nitride semiconductor layer 300 preferably likewise comprises gallium nitride. During the second growth step 25, growth primarily takes place in the lateral growth direction 11 due to the coalescence-promoting growth conditions. The third layer part 330 is thus mainly deposited on the side faces 302 of the nitride semiconductor layer 300. Only slight growth takes place in the vertical growth direction 12. Only a small part of the third layer part 330 is thus deposited on the c-surface 301 of the nitride semiconductor layer 300.

Figure 4:
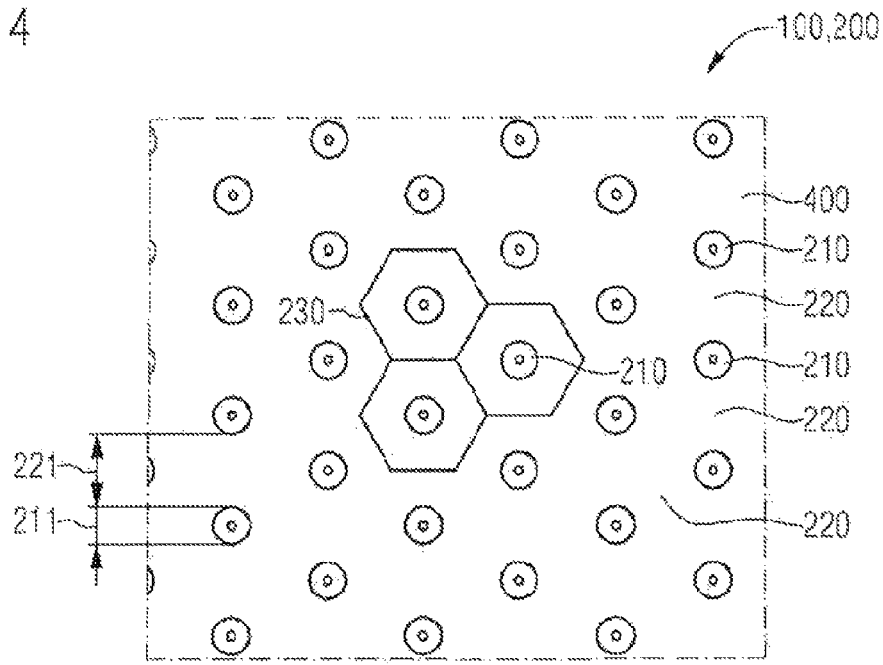
FIG. 4 is a plan view onto a mask layer of the multilayer structure.

FIG. 4 shows a plan view onto a part of the mask layer 200 of the multilayer structure 100. The mask layer 200 is arranged on a nucleation layer 400 which is visible in the regions of the mask openings 220. The nucleation layer 400 comprises aluminium (Al). The nucleation layer 400 preferably comprises aluminium nitride (AlN).

The lateral mask regions 210 of the mask layer 200 take the form of discs. Preferably, the disc-shaped lateral mask regions 210 have a circular disc shape which may however also be approximated by a polygon. Each disc-shaped lateral mask region 210 has a disc diameter 211. The disc diameter 211 is preferably in the range between 0.5 µm and 3 µm. For example, the disc diameter 211 may amount to 2 µm.

The disc-shaped lateral mask regions 210 are spaced from one another by the mask openings 220. Two mutually adjacent lateral mask regions 210 here in each case have a disc spacing 221 from one another. The disc spacing 221 preferably amounts to between 0.5 µm and 2 µm. For example, the disc spacing 221 may amount to 1 µm.

The lateral mask regions 210 are arranged in a regular hexagonal lattice 230. The hexagonal lattice 230 forms a honeycomb pattern. Each lateral mask region 210 is arranged in the centre of a hexagon of the hexagonal lattice 230. In this way, each lateral disc-shaped mask region 210 (apart from peripherally arranged lateral mask regions 210) has six nearest neighbours, which are each spaced from the lateral mask region 210 by the disc spacing 221.
Instead of the hexagonal lattice 230, a rectangular lattice or a triangular lattice could also be provided, in which the lateral mask regions 210 are arranged.

Figure 5:
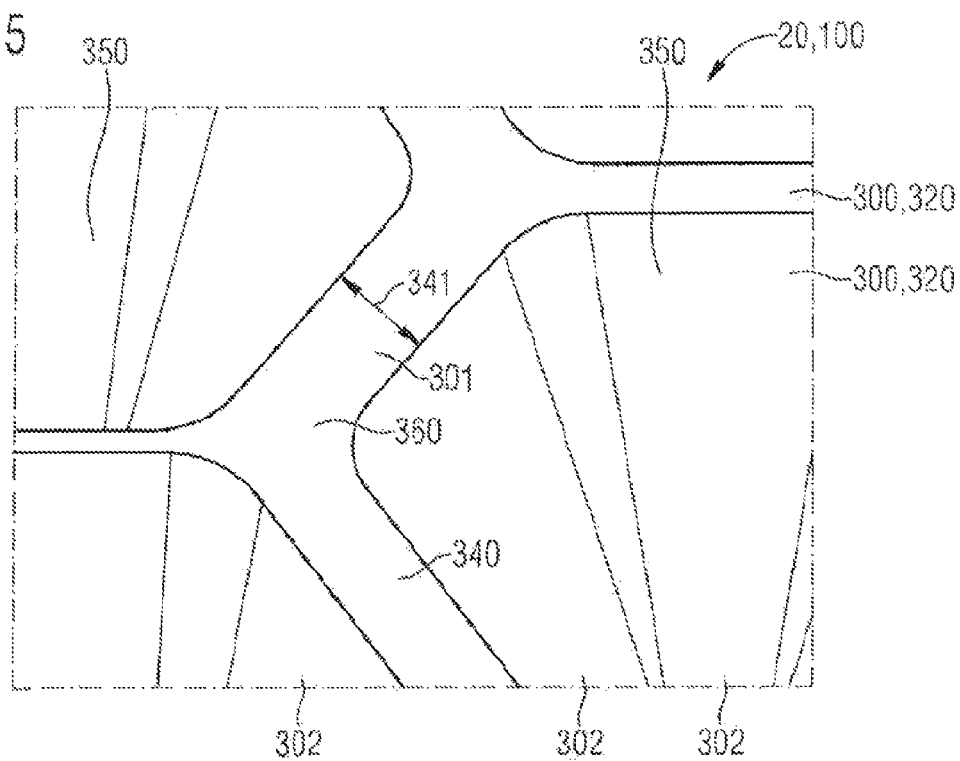
FIG. 5 is a perspective representation of a nitride semiconductor layer of the multilayer structure in the second processing state.

FIG. 5 shows a perspective representation of the nitride semiconductor layer 300 of the multilayer structure 100 in the second processing state 20. The second layer part 320 of the nitride semiconductor layer 300 has formed webs 340, which are arranged above the mask openings 220 in the mask layer 200. The webs 340 form a lateral lattice 360, which reproduces the hexagonal lattice 230 of the mask openings 220. Each web 340 has a web width 341 at its upper end (remote from the mask layer 200). The web width 341 is preferably less than the disc spacing 221 of the mask layer 200 and may for example amount to 500 nm.

The webs 340 of the second layer part 320 enclose frustopyramidal spaces 350, which are arranged above the lateral disc-shaped mask regions 210 of the mask layer 200. The frustopyramidal spaces 350 expand in frustopyramidal manner as their distance from the mask layer 200 increases. Since the webs 340 form the lateral hexagonal lattice 360, each frustopyramidal space 350 has an approximately hexagonal base area.

In the second growth step 25, the frustopyramidal spaces 350 are closed or coalesced in the lateral direction starting from the side faces 302 of the webs 340. Even the c-surfaces 301 of the webs 340 are partly overgrown in the process.

FIG. 6 shows a schematic sectional representation of the multilayer structure 100 in a fourth processing state 40. The fourth processing state 40 is achieved after completion of the second growth step 25. In the fourth processing state 40 the frustopyramidal spaces 350 are completely closed by the third layer part 330.

FIG. 6 additionally shows a substrate 500 not shown in FIGS. 1, 2 and 3 and the nucleation layer 400 not shown in FIGS. 1, 2 and 3 of the multilayer structure 100. The substrate 500 forms a carrier for the multilayer structure 100 and preferably comprises sapphire ($Al_2O_3$). Alternatively, the substrate 500 may comprise silicon (Si), silicon carbide (SiC) or gallium nitride (GaN). The substrate 500 preferably takes the form of a wafer.

FIG. 6 additionally shows a plurality of defects 110 in the nucleation layer 400 and the nitride semiconductor layer 300. The defects 110 may for example be dislocation defects, which arise due to a lattice mismatch between the nitride semiconductor layer 300, the nucleation layer 400 and the substrate 500.

The defects 110 continue in the vertical direction through portions of the multilayer structure 100. Defects 110 formed in the nucleation layer 400 below the lateral mask regions 210 of the mask layer 200 end at the lateral mask regions 210. However, defects 110 formed in the nucleation layer 400 below the mask openings 220 in the mask layer 200 continue vertically through the first layer part 310 and the second layer part 320 of the nitride semiconductor layer 300.

Defects 110 which in the process come into contact vertically with one of the side faces 302 of the second layer part 320, bend there and continue horizontally in the third layer part 330 as bent defects 111. These bent defects 111 may cancel one another out and then do not reach the top of the multilayer structure 100. Defects 110 which continue vertically as far as a c-surface 301 of the second layer part 320 are, in contrast, not bent, but rather continue vertically as continuing defects 112 through the third layer part 330 until they reach the top of the multilayer structure 100.

This results, at the top of the multilayer structure 100, in a laterally varying density of the defects 110. In lateral portions above the webs 340 of the second layer part 320 an elevated defect density results. In the other lateral portions, on the other hand, a reduced defect density results.

At the boundary between the mask layer 200 and the nitride semiconductor layer 300, two adjacent webs 340 of the second layer part 320 have a web spacing 351 from one another. The web spacing 351 may for example amount to approximately 1 µm.

In a subsequent method step, a functional layer sequence 600 comprising an actively luminous layer is deposited onto the top of the multilayer structure 100 shown in FIG. 6. The actively luminous layer of the functional layer sequence 600 comprises one or more quantum films.

It is known that during growth of an actively luminous layer above defects 110, V-defects (V-pits) preferably form, i.e. the greater the defect density in a lower-lying layer, the more V-defects form. It is likewise known that side facets of such V-defects have a reduced piezoelectricity relative to c-facets. It is likewise known that less indium is incorporated on facets of such V-defects and the growth rate is reduced in these regions. The result is that V-defects have a lower vertical electrical resistance than defect-free c-surfaces of actively luminous layers. However, in V-defects recombination of holes and electrons takes place predominantly non-radiatively.

FIG. 7 shows a plan view onto the top of the functional layer sequence 600 of the multilayer structure 100, as may for example be photographed using a PL microscope. In this case, crystal defects appear dark. It is clear that the top of the functional layer sequence 600 comprises lateral regions 120 with a high defect density and lateral regions 130 with a low defect density. The lateral regions 120 with a high defect density are located above the hexagonal lattice 230 of the mask openings 220 of the mask layer 200 and the lateral lattice 360 of the webs 340 of the second layer part 320 of the nitride semiconductor layer 300. The lateral regions with low defect density 130 form the remaining portions of the top of the functional layer 600 of the multilayer structure 100.

Every or almost every lateral region with a low defect density 130 comprises a gaseous inclusion 131. This gaseous inclusion 131 is known in the art as a void. Each gaseous inclusion 131 has been formed in the middle of a frustopyramidal space 350 arranged between webs 340. In the region of the gaseous inclusion 131, the frustopyramidal space 350 was ultimately closed during the second growth step 25 by the third layer part 330.

In the lateral regions 120 with high defect density the actively luminous layer of the functional layer sequence 600 has a higher density of V-defects than in the lateral regions 130 with low defect density. Since the lateral regions 120 with high defect density have a lower vertical resistance due to the presence of the V-defects, an electric current may flow vertically through the functional layer sequence 600 mainly in the lateral regions 120 with high defect density. Due to the lower series resistance in the vertical direction in the regions 120 with high defect density, more quantum films may be supplied with charge carriers. Since the current density per quantum film is thus lower, the droop of a light-emitting diode produced from the multilayer structure 100 may be reduced. Due to the smaller band gap of the quantum films in the lateral regions 130 with low defect density, charge carriers may diffuse from the lateral regions 120 with high defect density into the lateral regions 130 with low defect density. In the lateral regions 130 with low defect density these charge carriers may radiantly recombine. Consequently, the lateral regions 120 with high defect density bring about a current flow in the vertical direction and inject charge carriers into the lateral regions 130 with low defect density, where these may radiantly recombine.

The relative lateral dimensions of the lateral regions 120 with high defect density and the lateral regions 130 with low defect density relative to one another are selected so as to allow a sufficiently great vertical current flow to achieve a favourable high current linearity, without non-radiant recombination dominating in the lateral regions 120 with high defect density.

FIG. 8 shows a summarising schematic flow diagram of a method 700 for producing an optoelectronic device.

In a first method step 710 the substrate 500 is provided. The substrate 500 is preferably provided as a wafer. Then a multiplicity of optoelectronic devices may be produced simultaneously in parallel on the wafer. The substrate may be a sapphire substrate, a silicon substrate, a silicon carbide substrate or a gallium nitride substrate.

In a second method step 720, the nucleation layer 400 is applied to a surface of the substrate 500. The nucleation layer 400 may for example comprise aluminium nitride (AlN). The nucleation layer 400 may for example have a thickness of 50 nm. The nucleation layer 400 may be applied for example by sputtering.

In a third method step 730 the mask layer 200 is applied and patterned. The mask layer 200 may for example comprise a layer sequence of silicon dioxide ($SiO_2$), silicon nitride (SiN) and a further layer of silicon dioxide. The layers of silicon dioxide may for example have a thickness of approximately 100 nm and the layer of silicon nitride a thickness of approximately 50 nm. The mask layer 200 may for example be sputtered onto the nucleation layer 400.

After application the mask layer 200 is patterned, for example using a photolithographic method. In the process, the lateral mask regions 210 are laid, spaced by the mask openings 220. The lateral mask regions 210 are preferably laid in the form of circular discs or approximately circular (for example octagonal) discs. The disc diameter 211 of the lateral mask regions 210 may for example amount to between 0.5 µm and 3 µm, preferably approximately 2 µm. The disc spacings 221 between adjacent lateral mask regions 210 may amount for example to between 0.5 µm and 2 µm, preferably approximately 1 µm. Preferably the lateral mask regions 210 are arranged in a hexagonal lattice.

In a fourth method step 740 the first layer part 310 of the nitride semiconductor layer 300 is deposited in the mask openings 220 of the mask layer 200 and then etched back. The first layer part 310 may for example comprise gallium nitride (GaN) and be deposited in a thickness of approximately 90 nm. Deposition of the first layer part 310 may proceed for example in an installation for metalorganic vapour phase deposition (MOVPE installation). The material of the first layer part 310 is preferably nominally undoped. After deposition of the first layer part 310, the first layer part 310 is etched back. This may proceed for example in that a TMGa source of the MOVPE installation is closed and silane ($SiH_4$) is conveyed into the reactor. An $N_2/H_2/NH_3$ environment then prevails, in which desorption of gallium nitride and growth of silicon nitride (SiN) takes place. The two processes take place concurrently. Etching back may be performed for example for 5 minutes and serves to control crystal distortion. The fourth method step 740 may be omitted in a simplified variant of the method.

In a fifth method step 750, the second layer part 320 of the nitride semiconductor layer 300 is grown in the first growth step 15. The second layer part 320 preferably comprises gallium nitride (GaN). The growth conditions are selected such that growth proceeds predominantly in the vertical growth direction 12 and the webs 340 form with trapezoidal cross-sectional areas 321. Under these growth conditions, a low ratio of less than 1000 may for example prevail between the Group V semiconductor and the Group III semiconductor. The temperature may be less than 1000° C. The silane ($SiH_4$) feed may then be stopped again.

In a sixth method step 760 the second growth step 25 is carried out, to grow the third layer part 330 of the nitride semiconductor layer 300. The third layer part 330 preferably likewise comprises gallium nitride (GaN). The second growth step 25 is performed under growth parameters which lead to a preferred growth in the lateral growth direction 11. In this way, the frustopyramidal spaces 350 between the webs 340 laid in the preceding method step 750 are closed and coalesced. The growth conditions during the second growth step 25 may for example comprise a high ratio between the Group V semiconductor and the Group III semiconductor and a high temperature of more than 1000° C. After the sixth method step 760 the nitride semiconductor layer 300 is consequently present as a closed layer with a laterally modulated density of defects 110.

In a seventh method step 770 the functional layer sequence 600 is deposited on the surface of the nitride semiconductor layer 300. The functional layer sequence 600 comprises an actively luminous layer. The functional layer sequence 600 is preferably an LED structure.

In optional further method steps the multilayer structure 100 produced in the preceding method steps may be further processed to yield a complete optoelectronic device. Method steps 780 to 810 demonstrate such a possibility by way of example.

In the eighth method step 780 the multilayer structure 100 is bonded to a carrier substrate. Bonding proceeds such that the functional layer sequence 600 of the multilayer structure 100 faces the carrier substrate. The carrier substrate may for example be a silicon substrate.

In a ninth method step 790 the substrate 500 and the nucleation layer 400 are detached from the other parts of the multilayer structure 100. Detachment may proceed for example using a process known as laser lift-off. If the nucleation layer 400 comprises aluminium nitride (AlN), separation does not take place until the nitride semiconductor layer 300 comprising gallium nitride (GaN) for example, due to the optical absorption edge of the aluminium nitride (AlN). In the lateral mask regions 210 of the mask layer 200 the middle layer of silicon nitride (SiN) acts as a separation region. Thus one part, of silicon dioxide ($SiO_2$), of the lateral mask regions 210 of the mask layer 200 remains on the detached nitride semiconductor layer 300, while another part, of silicon dioxide (SiO$_2$), of the lateral mask regions 210 of the mask layer 200 remains on the nucleation layer 400 and the substrate 500.

The layer of silicon dioxide (SiO$_2$) remaining on the nitride semiconductor layer 300 may serve in a tenth method step 800 as a hard mask for producing patterned outcoupling structures.

The layer of silicon dioxide (SiO$_2$) remaining on the nucleation layer 400 and the substrate 500 may be detached in an eleventh method step 810. The nucleation layer 400 remains on the substrate 500. The substrate 500 may then be used again to carry out the method 700.

This patent application claims priority from German patent application 10 2012 217 644.6, the disclosure content of which is hereby included by reference.

The invention has been illustrated and described in greater detail with reference to the preferred exemplary embodiments. Nevertheless the invention is not restricted to the disclosed examples, but rather other variations may be derived therefrom by a person skilled in the art, without going beyond the scope of the invention.

LIST OF REFERENCE SIGNS

10 First processing state
11 Lateral growth direction
12 Vertical growth direction
15 First growth step
20 Second processing state
25 Second growth step
30 Third processing state
40 Fourth processing state
100 Multilayer structure
110 Defect
111 Bent defect
112 Continuing defect
120 Lateral region with high defect density
130 Lateral region with low defect density
131 Hole
200 Mask layer
210 Lateral mask region
211 Disc diameter
220 Mask opening
221 Disc spacing
230 Hexagonal lattice
300 Nitride semiconductor layer
301 c-Surface
302 Side face
310 First layer part
320 Second layer part
321 Trapezoidal cross-sectional area
330 Third layer part
340 Web
341 Web width
350 Pyramidal space
351 Web spacing
360 Lateral lattice
400 Nucleation layer
500 Substrate
600 Functional layer sequence
700 Method
710 Providing the substrate
720 Applying the nucleation layer
730 Applying and patterning the mask layer
740 Applying the first nitride semiconductor layer part and etching back
750 Growing the second nitride semiconductor layer part in the first growth step
760 Growing the third nitride semiconductor layer part in the second growth step
770 Depositing the functional layer sequence
780 Bonding the multilayer structure to a carrier
790 Detaching the multilayer structure
800 Producing patterned outcoupling structures
810 Reusing the substrate

The invention claimed is:

1. A method for producing an optoelectronic device with the following steps:
   providing a substrate;
   applying a nucleation layer to a surface of the substrate;
   applying and patterning a mask layer on the nucleation layer;
   growing a nitride semiconductor in a first growth step, wherein webs are laid which form a lateral lattice, wherein the webs have trapezoidal cross-sectional areas in the direction of growth;
   laterally overgrowing the webs with a nitride semiconductor in a second growth step, to close spaces between the webs,
   wherein a surface of the webs having trapezoidal cross-sectional areas remote from the substrate is a c-surface running parallel to the substrate; and
   depositing, after the second growth step, a functional layer sequence comprising an actively luminous layer, wherein defects that extend in a vertical direction to the c-surface of the webs continue in the vertical direction and bring about a formation of v-defects in the functional layer sequence.

2. The method according to claim 1, wherein the spaces between the webs are frustopyramidal in form.

3. The method according to claim 1, wherein disc-shaped lateral mask regions are applied during patterning of the mask layer.

4. The method according to claim 3, wherein the disc-shaped mask regions are arranged in a lateral hexagonal lattice.

5. The method according to claim 3, wherein the disc-shaped mask regions are applied with a diameter of between 0.5 µm and 3 µm.

6. The method according to claim 3, wherein the disc-shaped mask regions are applied separated from one another by regions with a width of between 0.5 µm and 2 µm.

7. The method according to claim 1, wherein the second growth step is performed under growth parameters which promote coalescence.

8. The method according to claim 1, wherein the first growth step is performed at a lower temperature than the second growth step.

9. The method according to claim 1, wherein after the second growth step a functional layer sequence is deposited, which comprises an actively luminous layer.

10. The method according to claim 1, wherein a nitride semiconductor is deposited in openings in the mask layer prior to the first growth step, wherein etching back is then carried out.

11. The method according to claim 1, wherein the nucleation layer comprises aluminium.

12. The method according to claim 1, wherein the mask layer comprises two layers, which comprise silicon dioxide, and wherein the layers of the mask layer comprising silicon dioxide are separated by a layer comprising silicon nitride.

13. The method according to claim 1, wherein a multilayer structure arranged on the nucleation layer is detached, and wherein parts of the mask layer arranged on the detached multilayer structure are used as a hard mask for producing patterned outcoupling structures.

14. A method for producing an optoelectronic device comprising:
- providing a substrate;
- applying a nucleation layer to a surface of the substrate;
- applying and patterning a mask layer on the nucleation layer wherein lateral mask regions in the form of discs are laid by the pattering;
- growing a nitride semiconductor in a first growth step, wherein webs are laid which form a lateral lattice, wherein the webs have trapezoidal cross-sectional areas in the direction of growth, and wherein the growth takes place in a vertical direction on a c-surface of the resultant nitride semiconductor, the c-surface being remote from the substrate and running parallel to the substrate;
- laterally overgrowing the webs with a nitride semiconductor in a second growth step, to close spaces between the webs, wherein defects which come into contact vertically with one of the side faces of the webs bend, and wherein defects which extend in the vertical direction to the c-surface of the webs continue in the vertical direction, so that in lateral portions above the webs an elevated defect density results; and
- depositing, after the second growth step, a functional layer sequence comprising an actively luminous layer, wherein the defects that extend in the vertical direction to the c-surface bring about a formation of v-defects in the functional layer sequence.

* * * * *